United States Patent [19]

Jimenez

[11] Patent Number: 5,422,298

[45] Date of Patent: Jun. 6, 1995

[54] METHOD OF MANUFACTURING A PRECISION INTEGRATED RESISTOR

[75] Inventor: Jean Jimenez, Voiron, France

[73] Assignee: SGS-Thomson Microelectronics, S.A., Gentilly Cedex, France

[21] Appl. No.: 949,619

[22] Filed: Sep. 23, 1992

[30] Foreign Application Priority Data

Sep. 26, 1991 [FR] France ............... 91 12143

[51] Int. Cl.$^6$ ............................................. H01L 21/70
[52] U.S. Cl. .................................... 437/60; 437/918; 338/314
[58] Field of Search .................. 437/918, 47, 60; 148/DIG. 136; 257/379, 380, 307; 338/314

[56] References Cited

U.S. PATENT DOCUMENTS

| | | | |
|---|---|---|---|
| 3,947,866 | 3/1976 | Stellrecht | 437/918 |
| 4,602,421 | 7/1986 | Lee et al. | 148/DIG. 136 |
| 4,830,976 | 5/1989 | Morris et al. | 437/47 |
| 4,965,214 | 10/1990 | Choi et al. | 437/918 |
| 5,141,597 | 8/1992 | Adams et al. | 437/918 |
| 5,185,285 | 2/1993 | Hosaka | 148/DIG. 136 |

FOREIGN PATENT DOCUMENTS

| | | | |
|---|---|---|---|
| 56-33869 | 4/1981 | Japan | 437/918 |
| 1-89357 | 4/1989 | Japan | 437/918 |

*Primary Examiner*—Olik Chaudhuri
*Assistant Examiner*—S. Mulpuri
*Attorney, Agent, or Firm*—Robert Groover

[57] ABSTRACT

A precision resistor, on a semiconductor substrate, formed by using two polysilicon stripes to mask the oxide etch (and ion implantation) which forms a third conductive stripe in a moat (active) area of the substrate. The sheet resistance $R_p$ and a patterned width $W_p$ of the polysilicon stripes and the patterned width $W_M$ and sheet resistance $R_M$, are related as $R_p W_p = 2 R_M W_M$. By connecting the three stripes in parallel, a net resistance value is achieved which is independent of linewidth variation.

18 Claims, 1 Drawing Sheet

METHOD OF MANUFACTURING A PRECISION INTEGRATED RESISTOR

PARTIAL WAIVER OF MASKWORK PROTECTION

Portions of the material in the specification and drawings of this patent application are subject to protection under the maskwork registration laws of the United States and of other countries. However, permission to copy this material is hereby granted to the extent that the owner of the maskwork rights has no objection to the facsimile reproduction by anyone of the patent document or patent disclosure, as it appears in the United States Patent and Trademark Office patent file or records, but otherwise reserves all maskwork rights whatsoever.

BACKGROUND AND SUMMARY OF THE INVENTION

The present invention relates to the field of integrated circuit devices and fabrication, and more particularly to structures and methods for manufacturing of a resistor in an integrated circuit.

Parameter Variation in Integrated Circuit Manufacturing Variation in Sheet Resistance Even in a well-controlled integrated circuit manufacturing process, the sheet resistance of polysilicon resistors will vary with the thickness of the polysilicon layer, and will vary unpredictably in accordance with such factors as the grain size of the polysilicon (since dopants are often gettered by grain boundaries).

It is possible to design a circuit which allows trimming of individual resistors, by laser or electrical programmation of fuses, antifuses, or nonvolatile memory cells. However, this adds greatly to process cost, since trimming must be performed separately on each individual resistor. Thus, such trimming is completely impractical for many integrated circuit applications. Similarly, some integrated circuit applications use an external discrete resistor where high precision is required. This not only adds expense in system assembly, but also is limited (due to pinout limitations) to at most a few such external resistors per chip.

Much effort has been expended in designing circuits which are relatively insensitive to the absolute value of any one resistor in the circuit. However, there still remains a great need for improved accuracy in resistor values.

Linewidth Variation

Even in a well-controlled integrated circuit manufacturing process, the effective width of etched lines will include a slight unpredictable variation from the drawn width of the same lines.[1] This is caused by such factors as proximity or loading effects in plasma etching, resist thickness variation due to substrate topography, slight variations in plasma impedance and substrate temperature during etching, and slight differences in resist hardness due to variation in deposition or pretreatment conditions.

[1] See generally, e.g., Elliott, INTEGRATED CIRCUIT FABRICATION TECHNOLOGY (2nd ed. 1989).

Conventionally, a resistor in an integrated circuit is formed by delineating in a semiconductor substrate, or in a layer made of polycrystalline silicon or metal formed above this substrate, a stripe, the two extremities of which are provided with metallizations. Therefore, the resistance value depends upon the shape of the stripe and upon the resistivity of the material that constitutes it.

A well known advantage of integrated circuits is that two identical resistors formed in the same integrated circuit have the same value, and that two resistors having a determined geometry ratio will have an accurately determined value ratio. However, a drawback is that the absolute value of the resistance is not accurately determined. Indeed, from one manufacturing batch to another, conditions may vary, especially resist etching conditions which determine, following the masking step, the effective width and length of a basic area. Thus, resistors formed from the same mask in various manufacturing batches may exhibit value variations of several percent, this variation being liable to reach up to approximately 20%. Thus, in the field of integrated circuits, when designing a circuit, the operating parameters of the circuit are made dependent on a ratio of resistor values (or area ratios of transistors) rather than on the exact value of any one resistor. However, it would sometimes be useful to obtain resistors with well determined values. Hitherto, formation of such resistors has been practically impossible.

Thus, an object of the invention is to provide a resistor structure in an integrated circuit manufacturing technology, such that the resistor has an accurately predetermined value, independent of the manufacturing parameter fluctuations.

To achieve this object, one class of embodiments provides a precision resistor formed in a semiconductor substrate comprising two stripes made of a resistive conductive material disposed on an insulating material, each stripe having a first resistance per square $R_p$ and a normal width $W_p$, delineating between them, in the semiconductor substrate, a stripe having a normal width $W_M$ doped by using the stripes made of the resistive conductive material as a mask and having a second resistance per square $R_M$. Two metallizations connecting the first and second extremities, respectively, of the three stripes. The widths and resistances per square are determined so that $R_p W_p = 2 R_M W_M$.

According to an embodiment of the invention, the resistive conductive material is doped polycrystalline silicon.

According to an embodiment of the invention, the resistor is delineated by thick oxide regions surrounding a region in which the doped stripe extends, each of the stripes of the resistive conductive material extending partially over a thick oxide stripe and partially over a thin oxide layer prolonging each thick oxide stripe on the side of the other thick oxide stripe.

According to an embodiment of the invention, the assembly of the doped stripe and the stripes of the resistive conductive material is coated with an insulating layer and metallizations reach their extremities through contact apertures.

The invention further provides a method for manufacturing a precision resistor comprising the steps of forming thick oxide regions delineating between them a semiconductor substrate stripe coated with a thin oxide layer; coating the structure with a polycrystalline silicon layer; etching two stripes in the polycrystalline silicon layer; etching the thin oxide layer between the polycrystalline silicon stripes; doping the polycrystalline silicon stripes and the apparent stripe of the substrate; forming contacts at both extremities of the three stripes.

Suggestions have previously been made to combine a thin-film resistor in parallel with a diffused resistor. However, none of these suggestions appear to have suggested the innovative dimensional relation disclosed herein, nor to have suggested that this relation can be used to attain independence of linewidth variation.

The foregoing and other objects, features, aspects and advantages of the invention will become apparent from the following detailed description of the present invention when taken in conjunction with the accompanying drawings.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
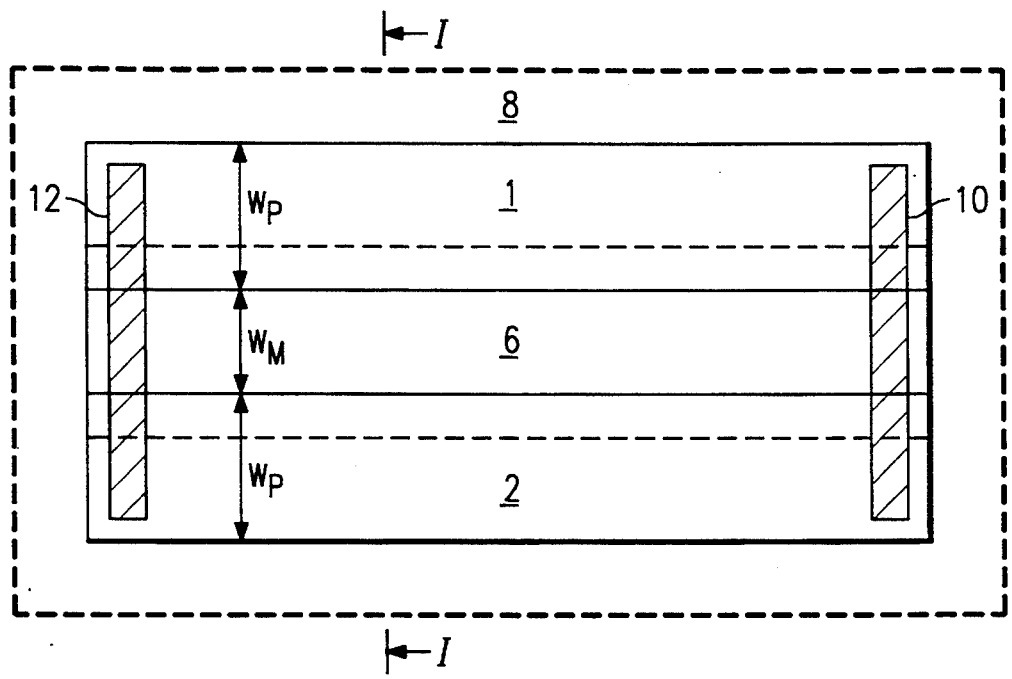
FIG. 1 is a top view of an embodiment of a precision resistor according to the invention.
Figure 2A:
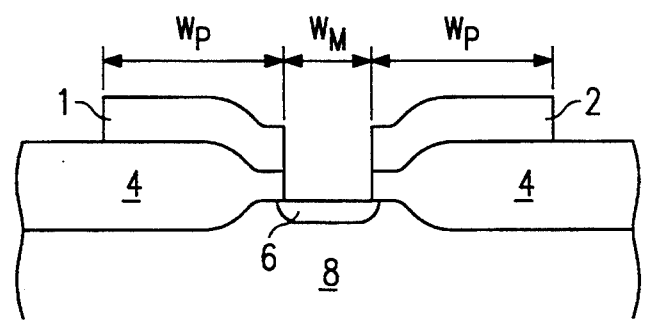
FIGS. 2A and 2B are cross sectional views, along line I—I, of the structure of FIG. 1.

As shown in FIGS. 1 and 2A, the invention provides a resistor formed by two stripes 1 and 2 made of a resistive conductive material; the stripes are formed on an insulating layer 4 over a semiconductor substrate. Between stripes 1 and 2 appears a substrate portion which is doped by using as a mask stripes 1 and 2 so as to form in the substrate a stripe 6 having a predetermined doping level. Of course, substrate 8 has a doping type opposite to that of stripe 6 or will be of the same doping type but with a much lower doping level. The first extremities of stripes 1, 2 and 6 are interconnected through a metallization 10 and the second extremities of the stripes are interconnected through a metallization 12.

In a preferred embodiment of the invention, the region where stripe 6 is formed is delineated by thick oxide layers extended by thin oxide layers and each conductive stripe 1 and 2 is formed so as to overlap both the thick and thin oxide in order, conventionally, to insulate stripe 6 from other integrated circuit components.

In a preferred embodiment of the invention, the conductive stripes 1 and 2 are made of polycrystalline silicon doped during the same doping step as stripe 6.

The structure shown in FIGS. 1 and 2A can be achieved by the following successive steps:
forming thick oxide areas 4 delineating a stripe in the semiconductor substrate;
forming on this stripe a thin oxide layer;
coating the substrate with a polycrystalline silicon layer;
etching the polycrystalline silicon to define stripes 1 and 2;
etching the thin oxide to expose the substrate between stripes 1 and 2;
diffusing or implanting a dopant in stripes 1 and 2 and the apparent stripe of the substrate to form stripe 6.

As is conventional in the field of integrated circuits, sheet resistances will be considered. Sheet resistance, for a homogeneous thin film, equals the bulk resistance divided by the film thickness. The units conventionally used for sheet resistances are ohms per square ($\Omega/\square$), since the sheet resistance is equal to the resistance between two metallizations formed on opposite sides of a square-shaped layer. In the following description, the edge and shape effects, well known by those skilled in the art, will be neglected. $R_p$ designates the resistance per square of the polycrystalline silicon stripe 1 or 2, and $R_M$ the resistance per square of the doped region 6 formed in the single-crystal silicon substrate 8. Then, the resistance per square R of the component shown in FIG. 1 will be $$1/R \approx 2/R_p + 1/R_M.$$

It will be demonstrated that, if the values of $R_p$ and $R_M$ are properly chosen in relation to width $W_p$ of stripes 1 and 2 and width $W_M$ of stripe 6, that a resistor having a resistance per square substantially independent of the manufacturing parameter variations can be obtained.

Figure 2B:
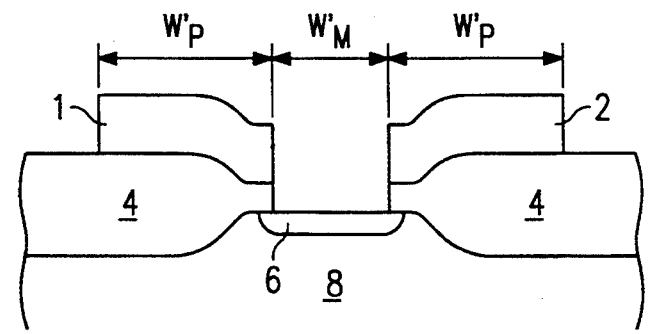

FIG. 2B shows a resistor, theoretically formed in the same way as the resistor of FIG. 2A, but in which etching parameters have changed to such an extent that the polycrystalline silicon stripes are more heavily etched, that is, are narrower than in the previous case. Thus, stripes 1 and 2 will now each have a width $W'_p$ such that $W'_p = W_p - 2dW$. Reciprocally, stripe 6 will have a width $W'_M = W_M + 2dW$. Then the resistance per square R' of the resistor shown in FIG. 1 comprising in parallel stripes 1, 2 and 6 will be:

$$\frac{1}{R'} = \frac{2}{R_p \frac{W_p}{W_p - 2dW}} + \frac{1}{R_M \frac{W_M}{W_M + 2dW}}$$

that is, $$\frac{1}{R'} = \frac{2W_p - 4dW}{R_p W_p} + \frac{W_M + 2dW}{R_M W_M}$$

$$\frac{1}{R'} = \frac{2}{R_p} + \frac{1}{R_M} - 2dW \left( \frac{2}{R_p W_p} - \frac{1}{R_M W_M} \right)$$

It can be seen that the value of the equivalent resistance R' can be rendered constant and equal to the above value R if the multiplication factor of dW is rendered null, that is, if:

$$R_p W_p = 2 R_M W_M.$$

This relation can be easily achieved for any determined doping level, by accordingly selecting the thickness of the polycrystalline silicon layer and/or the ratio of values $W_M$ and $W_p$.

Although the invention has been described particularly in the case where stripes 1 and 2 are polycrystalline silicon stripes, it will be noted that the invention also applies when the stripes are constituted by any other selected resistive material, for example thin metal layers, refractory metal layers or metal silicide layers.

In addition, the term "stripe" has been used in the above description to designate resistive regions disposed between electrodes 10 and 12. Those skilled in the art will note that these stripes are not necessarily rectilinear and that for layout requirements, any other pattern can be chosen, for example zigzag, curvilinear, spiral, etc.

Moreover, stripes 1 and 2 do not necessarily have equal widths.

Those skilled in the art will also note that the invention can be combined with various known techniques for manufacturing resistors, for example as regards isolation of the single-crystal region 6. Also, the whole structure described above can be coated with an insulating layer before forming metallizations 10 and 12, and contacts can be achieved on the extremities of the resistor stripes, the contacts being interconnected by metallizations.

Process parameters for a sample implementation of the invention are as follows. The epitaxial material typically has a dopant concentration of $10^{15}$–$10^{17}$ cm$^{-3}$ P-type. The polysilicon is deposited to a thickness=0.4–0.5 micron. The ion implantation step uses phosphorus at an area dose of 1.5E16 cm$^{-2}$ and an energy of 60 KeV. The resulting Poly sheet resistance $R_p$ will typically be in the neighborhood of 25 Ω/□, with a TCR of +0.1%/°C. The resulting implanted sheet resistance $R_M$ will typically be in the neighborhood of 10 Ω/□, with a TCR of +0.15%/°C.

These sheet resistance values imply that $W_p/W_M$ must be equal to 0.8 to minimize resistance spread at the ambient temperature. The resulting temperature coefficient will be approximately +0.125%/°C. The ion implantation dose is preferably chosen so that the temperature coefficients for the poly resistors and the diffused resistor are quite similar.

Polysilicon etching is performed using standard reactive ion etching in a chlorine-based chemistry. Selectivity requirements are fixed by the gate oxide thickness of the process. No specific photoresist process is required. Only a standard oversized mask is used to define the implanted area.

In the process of the presently preferred embodiment, the second polysilicon layer (Poly 2) is used to define resistors and the top plates of Poly/Poly capacitors. The short oxide etch is not necessary if the pad oxide is thin enough (typically less than 800 Å). No masking step is added, since an N+ implant mask is already used (for guard-rings, sources/drains, etc.).

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit fabrication method, comprising the steps of:
   (a.) providing a substrate which includes at least one substantially monolithic body of semiconductor material;
   (b.) forming an insulating layer, in a substantially desired pattern, over portions of said monolithic body of semi-conductor material;
   (c.) forming a resistive material over portions of said insulating layer;
   (d.) etching said resistive material in a desired pattern to form first and second elongated strips defining an elongated gap therebetween;
   (e.) etching said insulating layer, using an anisotropic etch which is selective to said resistive material, under said elongated gap;
   (f.) implanting dopant atoms of conductive impurity into said monolithic body of semiconductor material under said elongated gap, to form a third elongated conductive strip; and
   (g.) connecting said first, second, and, third elongated strips electrically in parallel, to provide a precision resistor;
   wherein said implanting step and said step of etching said resistive material are performed with process parameters such that the width $W_P$ and eventual sheet resistance $R_P$ of each of said first and second elongated strips, the width $W_M$ of said elongated gap, and the eventual sheet resistance $R_M$ of said monolithic body under said elongated gap, are related approximately as $R_PW_P=2R_MW_M$.

2. The method of claim 1, wherein said monolithic body consists essentially of silicon.

3. The method of claim 1, wherein said step of implantation applies a dose and energy such that the TCR (temperature coefficient of resistance) of all of said strips is equal within a factor of 2.

4. The method of claim 1, wherein said step of implantation applies phosphorus.

5. The method of claim 1, wherein said step of implantation applies more than $10^{16}$ cm$^{-2}$ of dopant ions.

6. The method of claim 1, wherein said step of implantation applies N-type dopant ions.

7. The method of claim 1, wherein said substrate consists essentially of silicon, and said monolithic body is an epitaxial layer of silicon on said substrate.

8. The method of claim 1, wherein the ratio $W_p/W_M$ is less than 1.

9. An integrated circuit fabrication method, comprising the steps of:
   (a.) providing a substrate which includes at least one substantially first layer of semiconductor material;
   (b.) forming an insulating layer over at least some portions of said first layer of semiconductor material;
   (c.) depositing a thin film of polysilicon entirely over portions of said insulating layer;
   (d.) etching said thin film of polysilicon in a desired pattern to form first and second elongated strips which define an elongated gap therebetween;
   (e.) implanting dopant atoms into said first layer of semiconductor material under said elongated gap, to form a third elongated conductive strip; and (f.) connecting said first, second, and third elongated strips electrically in parallel, to provide a precision resistor;

wherein said implanting step and said step of etching said resistive material are performed with process parameters such that the width $W_P$ and eventual sheet resistance $R_P$ of each of said polysilicon strips, the width $W_M$ of said elongated gap, and the eventual sheet resistance $R_M$ of said first layer under said elongated gap, are related approximately as $R_P W_P = 2 R_M W_M$.

10. The method of claim 9, wherein said first layer consists essentially of silicon.

11. The method of claim 9, wherein said step of implantation applies a dose and energy such that the TCR (temperature coefficient of resistance) of all of said strips is equal within a factor of 2.

12. The method of claim 9, wherein said step of implantation applies phosphorus.

13. The method of claim 9, wherein said step of implantation applies more than $10^{16}$ cm$^{-2}$ of dopant ions.

14. The method of claim 9, wherein said step of implantation applies N-type dopant ions.

15. The method of claim 9, wherein said substrate consists essentially of silicon, and said first layer is an epitaxial layer of silicon on said substrate.

16. The method of claim 9, wherein the ratio $W_P/W_M$ is less than 1.

17. The method of claim 9, further comprising the prior step of depositing a first thin film of polysilicon, prior to said step of depositing polysilicon.

18. A method for manufacturing a precision resistor, comprising the steps of:

forming thick oxide regions delineating therebetween a semiconductor substrate stripe coated with a thin oxide layer;

depositing a polycrystalline silicon layer;

etching said polycrystalline silicon layer to form two stripes therein;

etching said thin oxide layer between said polycrystalline silicon stripes;

simultaneously doping said polycrystalline silicon stripes and also said substrate stripe where exposed between said polycrystalline silicon stripes;

and forming contacts on both extremities of said three stripes.

* * * * *